United States Patent
Eldridge et al.

(10) Patent No.: US 10,067,199 B2
(45) Date of Patent: Sep. 4, 2018

(54) ELECTRIC POWER DISTRIBUTION SYSTEM INCLUDING METERING FUNCTION AND METHOD OF EVALUATING ENERGY METERING

(71) Applicant: EATON CORPORATION, Cleveland, OH (US)

(72) Inventors: David Austin Eldridge, Knoxville, TN (US); Ronald L. Thompson, Knoxville, TN (US); Brandon J. Rogers, Knoxville, TN (US); Maximilian A. Mueller, Knoxville, TN (US)

(73) Assignee: EATON INTELLIGENT POWER LIMITED, Dublin 4 (IE)

( * ) Notice: Subject to any disclaimer, the term of this patent is extended or adjusted under 35 U.S.C. 154(b) by 1335 days.

(21) Appl. No.: 13/753,802

(22) Filed: Jan. 30, 2013

(65) Prior Publication Data
US 2014/0214218 A1 Jul. 31, 2014

(51) Int. Cl.
*G01R 31/40* (2014.01)
*H02H 7/22* (2006.01)
*G01D 4/00* (2006.01)
*H02J 13/00* (2006.01)
(Continued)

(52) U.S. Cl.
CPC .............. *G01R 31/40* (2013.01); *G01D 4/002* (2013.01); *H02H 7/22* (2013.01); *H02J 13/00* (2013.01); *H02S 50/10* (2014.12); *H02J 2003/146* (2013.01); *Y02B 70/346* (2013.01); *Y02B 90/241* (2013.01); *Y04S 20/32* (2013.01); *Y04S 20/36* (2013.01); *Y04S 20/44* (2013.01); *Y04S 20/525* (2013.01)

(58) Field of Classification Search
None
See application file for complete search history.

(56) References Cited

U.S. PATENT DOCUMENTS 4,446,503 A * 5/1984 Link et al. ............ 361/627
6,157,096 A * 12/2000 Vinciguerra ............ 307/125
(Continued)

OTHER PUBLICATIONS

European Patent Office, "International Search Report and Written Opinion", dated Mar. 27, 2014, 9 pp.
(Continued)

*Primary Examiner* — Sean Shechtman
(74) *Attorney, Agent, or Firm* — Eckert Seamans

(57) ABSTRACT

An electric power distribution system is used with an electric power source. The electric power distribution system includes a first device exchanging first electric power with the electric power source. The first device exchanges the first electric power with a plurality of second devices and meters first electric energy corresponding to the first electric power. The second devices exchange the first electric power with the first device. Each of the second devices exchanges second electric power as at least part of the first electric power with a number of corresponding electric loads and meter second electric energy corresponding to the second electric power. A processor includes a routine that compares the metered first electric energy from the first device with a sum of the metered second electric energy from each of the second devices, and responsively determines proper or improper operation of the electric power distribution system.

23 Claims, 11 Drawing Sheets

(51) Int. Cl.
*H02S 50/10* (2014.01)
*H02J 3/14* (2006.01)

(56) References Cited

U.S. PATENT DOCUMENTS

| | | | |
|---|---|---|---|
| 2007/0213879 A1* | 9/2007 | Iwamura | H04B 3/54 |
| | | | 700/292 |
| 2007/0247789 A1* | 10/2007 | Benson | G01D 4/006 |
| | | | 361/672 |
| 2008/0158752 A1* | 7/2008 | Hill | H02H 7/30 |
| | | | 361/64 |
| 2008/0167755 A1* | 7/2008 | Curt | 700/293 |
| 2009/0157545 A1* | 6/2009 | Mobley | 705/40 |
| 2010/0082174 A1* | 4/2010 | Weaver | 700/295 |
| 2010/0134089 A1 | 6/2010 | Uram et al. | |
| 2010/0256934 A1* | 10/2010 | Rohrbaugh | 702/62 |
| 2011/0218746 A1 | 9/2011 | Joo | |
| 2012/0221265 A1 | 8/2012 | Arya et al. | |
| 2013/0054183 A1* | 2/2013 | Afzal | G01R 15/142 |
| | | | 702/141 |

OTHER PUBLICATIONS

National Energy Technology Laboratory / Department of Energy, "430.01.03 Electric Power System Asset Optimization", DOE/NETL-430/061110, http://www.netl.doe.gov/energy-analyses/pubs/ElecAssetOptRep.pdf, Mar. 7, 2011, 47 pp.

\* cited by examiner

ELECTRIC POWER DISTRIBUTION SYSTEM INCLUDING METERING FUNCTION AND METHOD OF EVALUATING ENERGY METERING

CROSS-REFERENCE TO RELATED APPLICATION

This application is related to commonly assigned, copending U.S. patent application Ser. No. 13/753,793, filed Jan. 30, 2013, entitled "Annunciating or Power Vending Circuit Breaker for an Electric Load".

BACKGROUND

Field

The disclosed concept pertains generally to electric power distribution and metering and, more particularly, to electric power distribution systems that meter electric energy. The disclosed concept further pertains to methods of evaluating energy metering of an electric power distribution system.

Background Information

Meters are used by electric utilities to measure and bill for electricity usage. Typically, meters need to be accessible, replaceable, testable and tamper-resistant. Meters need to be accessible and readable by both the utility and its customers to ensure correct meter readings. Meters need to be replaceable in the event of a malfunction, and testable to verify accuracy. Also, a mechanism needs to be provided to protect against theft of power or, otherwise, improper or inadvertent bypassing or tampering of the meter, which results in inaccurate billing of actual electricity usage.

Conventional glass bulb meters meet these requirements and are accepted by public utility commissions due to their historical success in meeting the above four needs in a cost effective manner. The glass bulb meter is a relatively inexpensive, simple device used to accurately measure the energy (kWh) and peak demand power (kW) within an agreed upon demand window used at a customer premise. These meters were originally electromechanical devices, but are being replaced by electronic meters. These meters are accessible, although not necessarily private, since they are typically located on the outside of a building and are easily read by anyone who walks up to them. Such meters are easily removed and replaced by utility service personnel. Glass bulb meters can be bench tested using a known power source and they are also protectable by using lockout tags to prevent tampering.

Electric utilities are required by their public utility commissions to test the accuracy of their meters. These tests normally follow the ANSI C 12.1 and ANSI/ASQ Z1.9 standards. Typically, a statistical sampling plan is used to verify meter accuracy. This statistical sampling plan states that the sample will, 95 times out of 100, correctly determine whether at least 97.5% of a homogeneous lot of meters are within the range of accuracy specified by the utility.

ANSI C 12.1 allows other types of tests to verify metering accuracy including a periodic test schedule and a variable interval plan. These tests verify each individual meter used by the utility. This is clearly a better practice for the utility and its customers, however, meter deployments of most utilities are simply too large for this type of testing to be practical.

Automatic meter reading adds one-way communication, in order that a meter can communicate back to the electric utility office at regular intervals. This improves accessibility because now the data can be made accessible over the Internet or an appropriate, utility-owned communication network. Also, the electric utility no longer has to send "meter reader" personnel to physically read each meter, since the reading can be done automatically. The meter can also employ sensors, in order that if there is some kind of malfunction or if it detects tampering, then it can send a corresponding message to the electric utility.

Advanced meter infrastructure (AMI) or smart meter rollouts are currently employed in various service territories. AMI adds two-way communication between the meter and the electric utility. By adding the ability to "listen" in addition to being able to "talk", electric utilities can realize additional benefits. Variable time of use schedules and real time pricing are two applications where the utility can change how the meter is billing the customer based on the conditions of the utility grid. Some smart meters have integrated service disconnects that can be triggered remotely if the utility bill is not timely paid. These meters may also include communication into the premise to communicate with end devices. This allows a utility to perform demand response or load control and actively manage participating loads on the utility grid. This new command functionality creates an additional metric to value a meter. While the benefits have not yet been fully realized and standard ways for end devices and the meter to communicate are still under development, smart grid demonstrations across the country are proving the value created by command functionality.

Electric vehicles (EVs) are a relatively new category of load on the utility grid and represent a huge potential growth of electricity demand from the grid. This is a double-edged sword for utilities—they want to sell more power, but want to do so during off-peak hours. A recent report shows that the current generation asset utilization in the U.S. is only about 47%. As a result, generation capacity does not need to be increased to support additional load, if power is consumed during off-peak times.

EVs have an additional benefit of reducing $CO_2$ emissions. This improves air quality and reduces emissions. In places like California, this and the success of EVs is very important. However, California has a counter-intuitive, tiered approach to selling electricity. As a customer buys more energy, punitive action is taken against them, in order that the cost per kWh increases as usage increases. This creates a dilemma EVs put customers in a higher tier of electric prices, but help to reduce emissions and clean the air.

This situation has resulted in "utility grade sub-metering" in electric vehicle supply equipment (EVSE). California wants to subsidize the energy used to charge EVs, but currently takes punitive action against customers with electric vehicles. The solution is that the EV becomes a "special load" with a special rate structure, such that the consumer is encouraged to adopt the technology which is mutually beneficial to both the utility and the consumer. As EV and other "special loads" (e.g., on-site solar and wind generation; distributed energy storage; intelligent appliances) are added to a premise, it makes the utility's current methodologies for metering less effective and less beneficial to both the utility and the consumer. As a result, this presents an opportunity for the public utility commissions to accept alternative methodologies and form factors other than the current glass bulb meter. This would allow metering and billing of every load differently and separate from one another in a manner that does make it mutually beneficial.

There is room for improvement in electric power distribution systems.

There is also room for improvement in methods of evaluating energy metering of an electric power distribution system.

SUMMARY

These needs and others are met by embodiments of the disclosed concept. In accordance with one aspect of the disclosed concept, an electric power distribution system is for use with an electric power source. The electric power distribution system comprises: a first device exchanging first electric power with the electric power source, the first device being structured to exchange the first electric power with a plurality of second devices and to meter first electric energy corresponding to the first electric power; the plurality of second devices structured to exchange the first electric power with the first device, each of the second devices being structured to exchange second electric power as at least part of the first electric power with a number of corresponding electric loads and to meter second electric energy corresponding to the second electric power; and a processor comprising a routine structured to compare the metered first electric energy from the first device with a sum of the metered second electric energy from each of the second devices, and to responsively determine proper or improper operation of the electric power distribution system.

As another aspect of the disclosed concept, a method evaluates energy metering of an electric power distribution system for use with an electric power source, the electric power distribution system comprising a first device exchanging first electric power with the electric power source, the first device exchanging the first electric power with a plurality of second devices and metering first electric energy the corresponding to the first electric power, the plurality of second devices exchanging the first electric power with the first device, each of the second devices exchanging second electric power as at least part of the first electric power with a number of corresponding electric loads and metering second electric energy corresponding to the second electric power. The method comprises: summing the metered second electric energy from each of the second devices; and comparing with a processor the metered first electric energy from the first device with the summed metered second electric energy from each of the second devices, and responsively determining proper or improper operation of the metering first electric energy and the metering second electric energy.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; control electronics; a logic circuit; or any suitable processing device or apparatus.

As employed herein, the term "load" shall mean a power-consuming load and/or a power-generating load.

As employed herein, the term "power source" shall mean a utility grid or another suitable electric power source that can send and/or receive electric power.

As employed herein, the terms "exchange", "exchanging" and derivatives thereof shall mean receiving and/or sending. For example and without limitation, when used in the context of exchanging electric power, this shall mean receiving electric power for a power-consuming load and/or sending electric power for a generator or power-generating load.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The disclosed concept is described in association with single-pole circuit breakers, although the disclosed concept is applicable to a wide range of circuit breakers and other electrical devices, such as meters, having any suitable number of poles.

Figure 1:
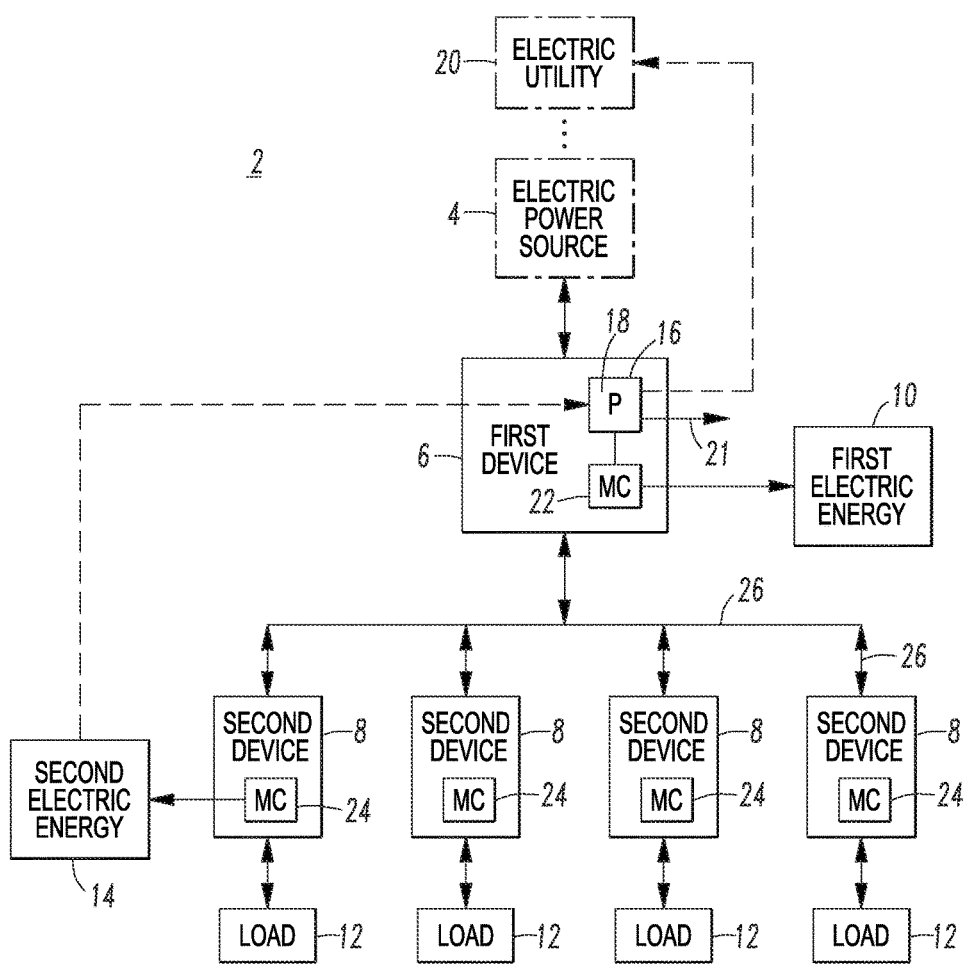
FIG. 1 is a block diagram of an electric power distribution system for an electric power source in accordance with embodiments of the disclosed concept.

FIG. 1 shows an electric power distribution system 2 for an electric power source 4 (shown in phantom line drawing). The system 2 includes a first device 6 exchanging first electric power with the electric power source 4. The first device 6 is structured to exchange the first electric power with a plurality of second devices 8 and to meter first electric energy 10 corresponding to the first electric power. The second devices 8 are structured to exchange the first electric power with the first device 6. Each of the second devices 8 are structured to exchange second electric power as at least part of the first electric power with a number of corresponding electric loads 12 and to meter second electric energy 14 corresponding to the second electric power. A processor (P) 16 includes a routine 18 structured to compare the metered first electric energy 10 from the first device 6 with a sum of the metered second electric energy 14 from each of the second devices 8, and to responsively determine 21 proper or improper operation of the electric power distribution system 2.

The first device 6 can be any upstream power distribution device up to and including the generation source (e.g., electric power source 4) and the second devices 8 can be a plurality of any power distribution devices electrically connected downstream of the first device 6.

Example 1

The routine 18 is further structured to notify an electric utility 20 corresponding to the electric power source 4 responsive to the determined improper operation.

Example 2

Each of the first device 6 and the second devices 8 includes a metering circuit (MC) 22 and 24, respectively.

Example 3

The routine 18 is further structured to adjust the compare for at least one of energy losses in power conductors 26 operatively associated with the second devices 8, and expected errors in the metering circuits 22,24.

Example 4

The use of electric vehicles (EVs), and other "special loads" as disclosed herein, presents an opportunity to change the form factor of a conventional glass bulb utility meter. The disclosed concept can be used in connection with a controllable, electronic circuit breaker 100 including metering 102 and communication 134 functions along with support for a number of add-on modules 126 as shown with the example power vending machine (PVM) circuit breaker (PVMCB) 100 of FIGS. 2 and 3. The remotely controllable PVMCB 100 and a utility grade metering function are combined with electric vehicle supply equipment (EVSE) in the example add-on module 200 (FIG. 4).

The example PVMCB 100 provides branch circuit, utility-grade metering within the circuit breaker. This allows the use of, for example, multiple rates, schedules and prices, within the same premise. Furthermore, it increases the resolution of metering and exposes exactly where and when electricity is being used (from which the "why" can be extrapolated). By embedding metering into a smart circuit breaker, control and demand response for non-communicating or non-controllable end devices or emergency load shedding can also be performed.

In a PVM panel or load center 400 (FIG. 7), potentially every circuit breaker in the panel, including the main circuit breaker 402 (FIG. 7), can be a PVMCB. Each circuit breaker can communicate. One circuit breaker, such as the main circuit breaker 402, can perform the routine 18, which repetitively tests and verifies the accuracy of the metering by ensuring that the incoming power matches the outgoing power. In the event of a failure, the panel can automatically determine which meter failed and notify both the customer and the electric utility. This reduces theft of power by ensuring that power flowing into the panel is accounted for by being sourced to specific branch power circuits.

The example PVMCB 100 can employ any suitable rating, number of poles and frame size. Because it is electronic, protection is provided using software functions (e.g., without limitation, ground fault; arc fault; combination; metering accuracy), with or without the number of add-on modules 126. Power circuit protection can include overcurrent protection, short circuit protection, optional ground fault protection, optional arc fault protection, optional overvoltage protection, and optional undervoltage protection. For EVSE applications, preferably safe automatic and manual resetting with lockout is provided.

Electric metering with, preferably, up to utility grade accuracy (e.g., without limitation, ±0.2% in accordance with ANSI C-12.20 and IEC 687) can be provided. The PVMCB 100 provides time-stamped values of both net energy (Watthours) and peak demand (Watts) as calculated within a configurable window size and reset at configurable time intervals. Also, other energy-related values are also accessible and logged including voltage, current, power (being consumed by the load or generated and fed into the circuit breaker panel), and time/clock.

The PVMCB 100 also includes an expansion port 124 (FIG. 3) that provides on/off control and communication. This permits the interface with a number of add-on modules including status information, such as for example and without limitation, on/off/tripped, fault reason, fault time, time until reset, number of operations, serial number, clock, and firmware version.

The PVMCB 100 can replace a conventional glass bulb meter by offering branch power circuit level metering and two-way communication which provides remote on/off control, status information, metering, and time of use information back to the utility. Additionally, test points can be provided on each circuit breaker or at a single common point of the load center or panelboard, which can take a circuit breaker (or a group of circuit breakers) out of service, run a known amount of power through it, and verify the meter output. Hence, there is no need to remove a circuit breaker and put it on a test bench. The testing apparatus could optionally be embedded into the load center and run the tests automatically.

In a complete PVM panel or load center, the disclosed routine 18 verifies the metering function 102 (FIG. 2) sub-system of each PVMCB 100 by comparing and verifying that the total or summed incoming energy ($E_{in}$) matches the total or summed outgoing energy ($E_{out}$) as shown by Equation 1:

$$\Sigma E_{in} = \Sigma E_{out} \qquad (\text{Eq. 1})$$

For an observable system in the real world, Equation 1 is expanded as shown by Equation 2:

$$\Sigma E_{in} = \Sigma E_{out} + \Sigma E_{loss} + \Sigma \text{Errors} \qquad (\text{Eq. 2})$$

wherein:

$E_{loss}$ is energy leaving the electric power distribution system 2 that is not directly accounted for or measured (e.g., without limitation, in an electric power circuit, a primary contributor is the energy lost due to heating of power conductors and the surrounding environment by line or load current; and Errors accounts for the fact that there are no perfect instruments and any measurement will have errors in both accuracy and precision (e.g., without limitation, relatively good instruments have a relatively very low error, which may be negligible but is always present to some degree).

For the PVM routine 18, Equation 2 is calculated as follows. $\Sigma E_{in}$ is the sum of the incoming energy from any number of power sources. This can include the incoming energy from the utility grid and/or from any number of other electric power generation sources. In a circuit breaker panel, for example, this is measured by energy flowing through the main PVMCB. $\Sigma E_{out}$ is the sum of all outgoing energy to any number of loads. In a circuit breaker panel, for example, this is the sum of all energy flowing through all of the branch PVMCBs, such as for example and without limitation, dedicated branch circuit breakers for HVAC, washers and dryers, and non-dedicated circuit breakers for lighting and receptacles. $\Sigma E_{loss}$ is calculated through a suitable software function (e.g., based on known meta-data characteristics and parameters, but potentially different for each installation; this could be calibrated during the initial installation to provide more accurate results; the on-going function and processing could be stored in the main circuit breaker/meter along with its initial calibration settings and parameters) based on current, voltage, power, energy, time and known physical characteristics (e.g., without limitation, material composition; conductor ratings and sizes). Through probability and statistics, this software function can be confirmed as being a reliable solution. $\Sigma$Errors is the sum of all errors in the electric power distribution system 2. This could include known measurement errors and errors in the software function for $E_{loss}$. This could also be implemented as a tolerance or an allowable percentage based error.

The routine 18, which constantly compares energy in and energy out, fails when Equation 3 is true:

$$\Sigma E_{in} - \Sigma E_{out} \geq \in, \text{ where } \in = \Sigma E_{loss} + \Sigma \text{Errors} \quad \text{(Eq. 3)}$$

When the routine 18 fails, or optionally fails multiple cycles to prevent false positives, the utility and the customer receive a notification. The routine 18 then performs analytics to determine the failed meter. These analytics can include but are not limited to: (1) searching for load events and comparing them with known load signatures; (2) analyzing environmental patterns with typical load use profiles; (3) employing metadata; and (4) employing known failure modes.

Example 5

For example, searching for load events and comparing them with known load signatures can include searching for a power circuit of the electric power distribution system 2 that has never previously pulled over 10 A, but is currently reporting 50 A. A load signature can include, for example, history, prior failures, typical power signatures and behavior, time of day, and use patterns.

Example 6

As another example, analyzing environmental patterns with typical load use profiles, can include, for example, using current weather data that says it is 90 degrees outside, but the air conditioning power circuit is not pulling any power. As a result, the failure reported by the routine 18 is likely caused by a faulty meter associated with the air conditioning power circuit.

Example 7

For metadata, power circuits can be tagged with, for example, load type, rated current, number of operating cycles, and installation date. For example, a washing machine is tagged as not being a power generating source and the corresponding metering circuit will not report sourced power from the washing machine unless it has failed. As another example, a power circuit rated for 20 A will not continuously allow 100 A to be pulled unless the corresponding circuit breaker has failed.

As further examples, number of operating cycles and installation date of the circuit breaker can be used to help the analytics rank suspected failing metering circuits. For example, based on field trials it can be learned that when a particular circuit breaker reaches 10 years of age it has a corresponding, for example and without limitation, 20% percent chance of failing. Similarly, one of the circuit breakers that has gone through 10,000 operations in a year may have experienced a relatively larger amount of fatigue than the others and is, therefore, more likely to be subject to failure.

For known failure modes, once devices are deployed to the field and begin to fail, these failure modes can be analyzed and added to the analytics through a firmware update. For example, once PVMCBs are built, tested, deployed, and failures occur, the failures can be studied and algorithms can be incorporated to better detect such failures. For example and without limitation, a flaw in a current or voltage sensor used in the circuit breaker might be linked to relatively very rapid and repeated cycling of the circuit breaker. This newly found knowledge can be applied to a firmware update to better detect the failure mode and, thus, the failed meter.

If the routine 18 is able to determine the faulty meter to a predetermined confidence, then the electric utility and customer will be notified.

If the faulty meter remains unknown, if it is allowed by the customer, and if predetermined thresholds have not been reached for various conditions (e.g., without limitation, number of on/off cycles; total amount of time turned off (e.g., loads can be turned off in order to isolate the error, but there are certain loads that a user may not want to be turned off for an extended period (e.g., refrigerator; air conditioner; washer/dryer), because if they are turned off, it could adversely affect them; hence, the user may allow the system to turn off the load to determine the error as long as they are not off for longer than, for example, 5 minutes or whatever they prefer)), then the routine 18 can cycle loads to gain additional information to be used in the analytics. This cycle can continue until the faulty meter is determined or the routine 18 ceases to report a failure (e.g., the meter was replaced or the problem stops happening).

Once the faulty meter is determined, the faulty meter power/energy can be determined by the routine 18. This is given by Example 23 and Equation 4, below.

Example 8

As will be discussed, below, in connection with FIGS. 2 and 3, an example single-phase PVMCB 100 can bill a user for energy consumed through the PVMCB. For example, the metering function 102 (FIG. 2) uses a logic circuit 104 (FIG. 3) to store time-stamped energy values 106 in a persistent database 108 in memory 110. Both of the metering function 102 and the logic circuit 104 are within the housing of the PVM circuit breaker 100. The energy values 106, during certain time-stamps, can be "flagged" as belonging to a number of specific users, which provides energy allocation to each of such number of specific users. For example, when the electric load 112 (shown in phantom line drawing in FIG. 2), such as an EV, is plugged in, the energy can be suitably allocated (e.g., without limitation, to the EV's vehicle identification number (VIN) or to an RFID tag swiped to allow charging, which will allocate the energy to the corresponding user; to any number of groups associated with the EV or the user). The PVMCB 100 also allocates energy to its specific power circuit (e.g., to electric load 112 at terminals 114,116 (FIG. 3)).

Figure 2:
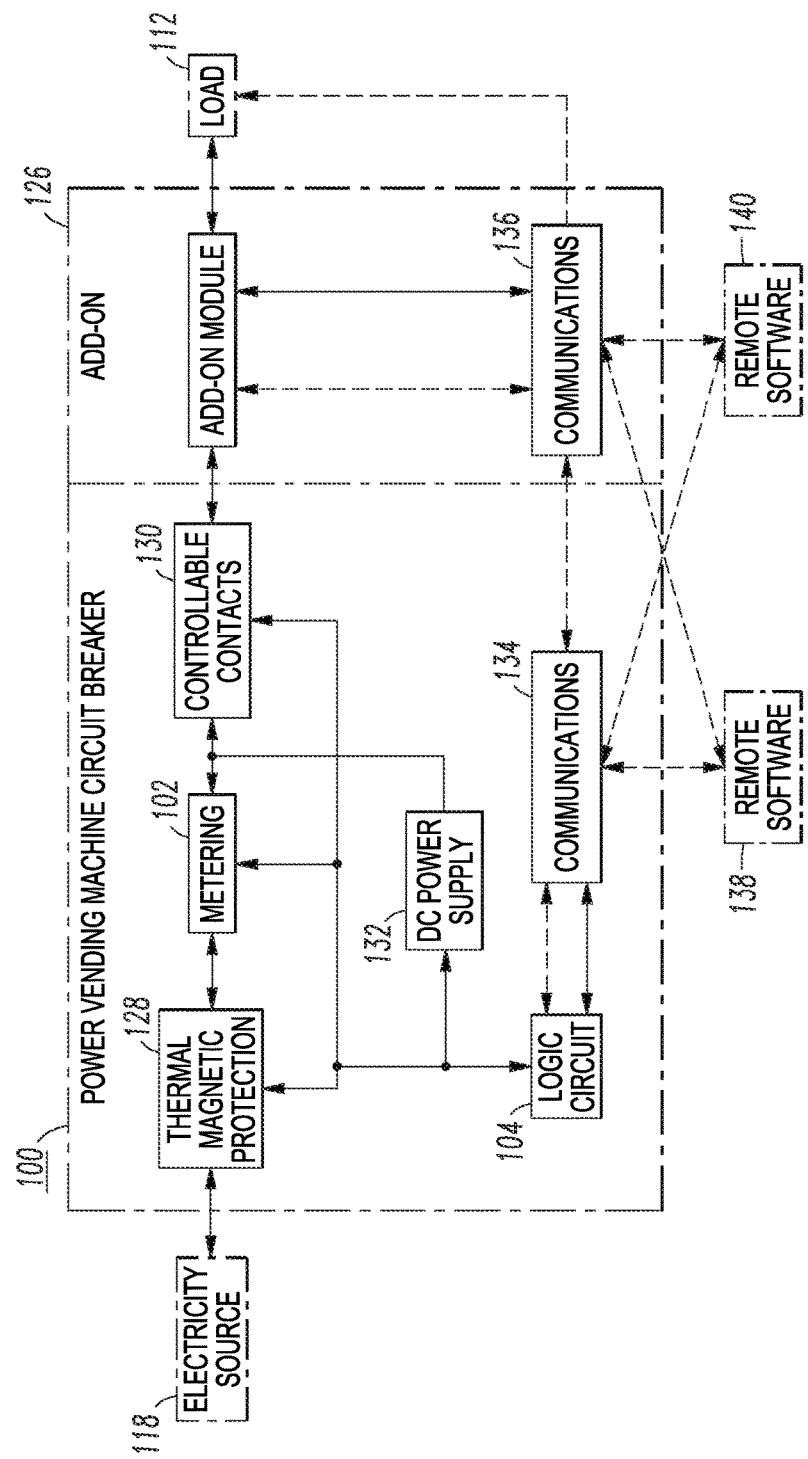
FIG. 2 is a simplified block diagram of a single-phase power vending machine (PVM) circuit breaker in accordance with an embodiment of the disclosed concept.
Figure 3:
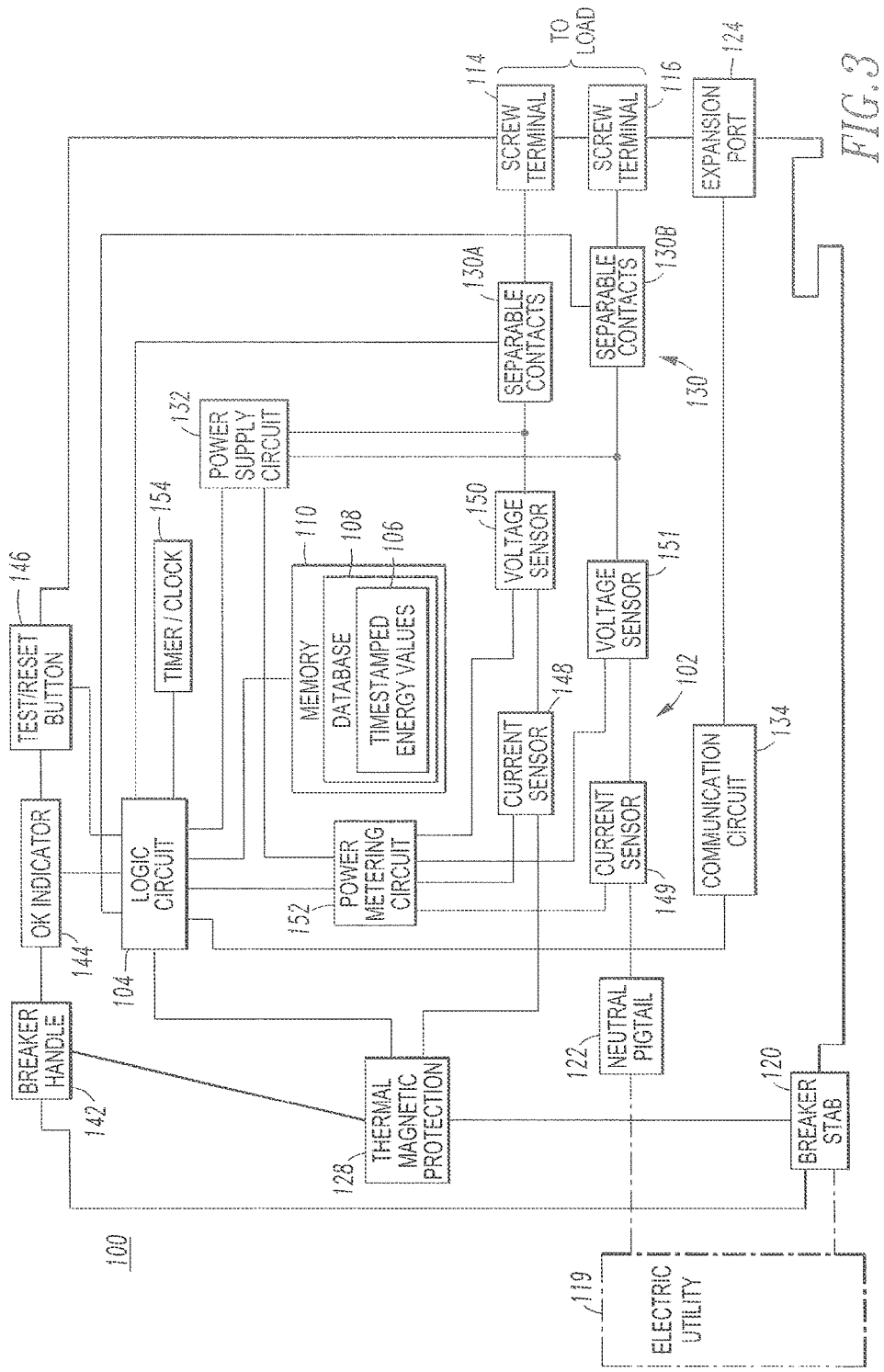
FIG. 3 is a relatively more detailed block diagram of the PVM circuit breaker of FIG. 2.
Figure 4:
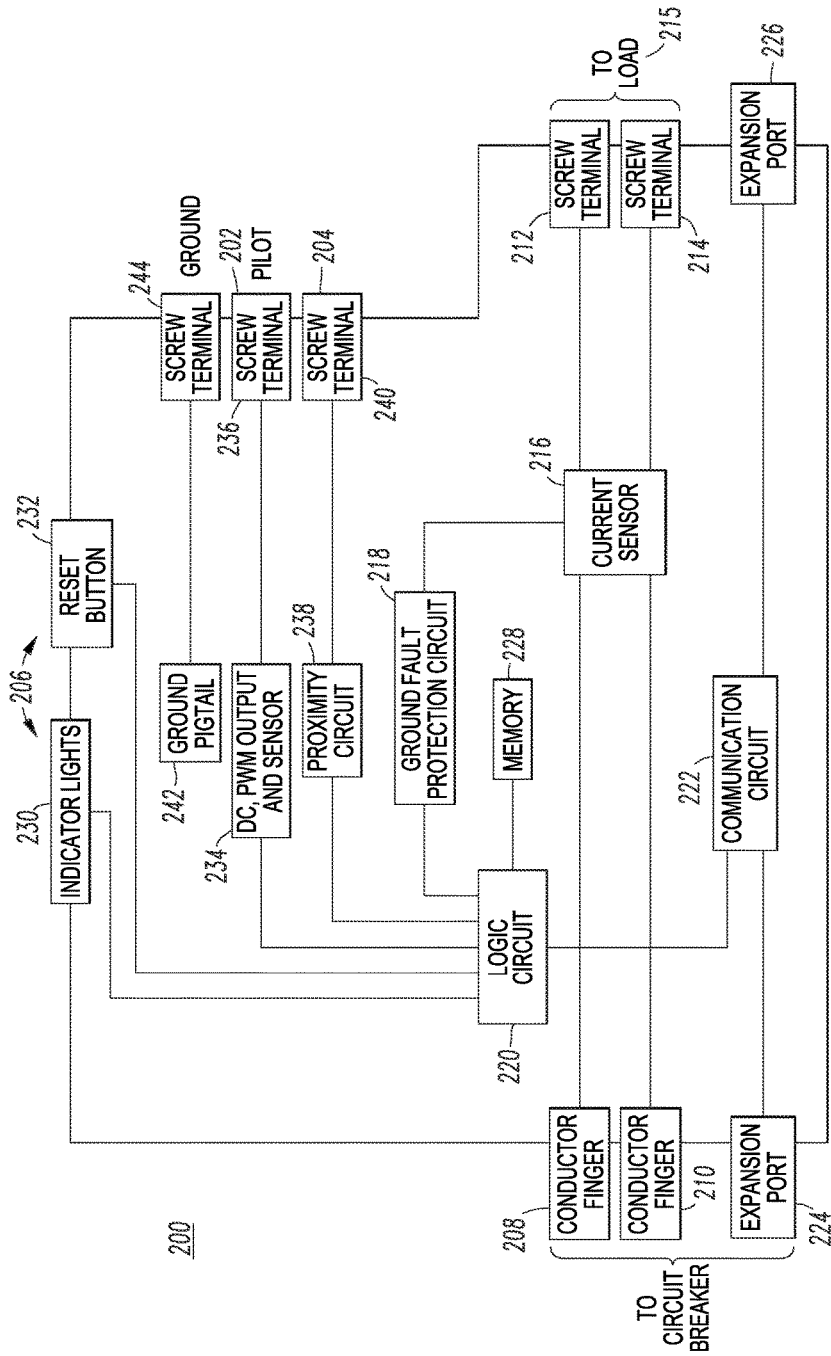
FIG. 4 is a relatively more detailed block diagram of the EV add-on module of FIG. 3.

When an electricity source, such as an electric utility 119 (shown in phantom line drawing in FIGS. 2 and 3), which supplies power to breaker stab 121) (e.g., from a hot line or bus bar (not shown)) and neutral pigtail 122 (e.g., to a neutral bar (not shown)) at a panelboard or load center (not shown), is ready to bill the user, it can do so in a variety of ways through communication done via the expansion port 124 (FIG. 3). One example method is a "meter read" of the total energy at the time of the reading from a main circuit breaker (not shown, but which can be substantially the same as or similar to the PVMCB 100, except having a relatively larger value of rated current) of a corresponding panelboard or load center (not shown). The value of the "meter read" is compared with the value of the "meter read" from, for example, the previous month's reading and the difference value is billed.

Alternatively, the electric utility 119 can download the database 108 of each circuit breaker, such as 100, in its entirety, query the energy values 106 as appropriate, and then apply a suitable rate structure using the time-stamps, specific circuits, and any allocation flags.

FIGS. 2 and 3 show the example controllable, PVMCB 100, which can include optional support for communications and/or a number of different add-on modules 126, as will be discussed.

Referring to FIG. 2, the example PVMCB 100 can include a number of optional add-on modules 126. An alternating current (AC) electrical path through the PVMCB 100 between the electricity source 118 and the load 112 includes a thermal-magnetic protection function 128, the metering function 102 and controllable separable contacts 130. An AC-DC power supply 132 supplies DC power to, for example, the logic circuit 104 and a communications circuit 134. Alternatively, the DC power supply 132 can be located outside of the PVMCB 100 and supply DC power thereto. The number of optional add-on modules 126 can provide specific logic and/or I/O functions and a communications circuit 136. Optional remote software functions 138,140 can optionally communicate with the communications circuits 134,136.

FIG. 3 shows more details of the example PVMCB 100, which includes an external circuit breaker handle 142 that cooperates with the thermal magnetic trip function 128 to open, close and/or reset corresponding separable contacts (not shown), an OK indicator 144 that is controlled by the logic circuit 104, and a test/reset button 146 that inputs to the logic circuit 104.

In this example, there is both a hot line and a neutral line through the PVMCB 100 along with corresponding current sensors 148,149, voltage sensors 150,151, and separable contacts 130A,130B for each line or power conductor. A power metering circuit 152 of the metering function 102 inputs from the current sensors 148,149 and the voltage sensors 150,151, and outputs corresponding power values to the logic circuit 104, which uses a timer/clock function 154 to provide the corresponding time-stamped energy values 106 in the database 108 of the memory 110. The current sensors 148,149 can be electrically connected in series with the respective separable contacts 130A,130B, can be current transformers coupled to the power lines, or can be any suitable current sensing device. The voltage sensors 150,151 can be electrically connected to the respective power lines in series with the respective separable contacts 130A,130B, can be potential transformers, or can be any suitable voltage sensing device.

Example 9

FIG. 4 shows one example of the number of add-on modules 126 of FIG. 2, which can be an EV add-on module 200. The example module 200 adds a hardware and software implementation of a suitable EV communications protocol, ground fault detection at relatively low thresholds, and control of the controllable separable contacts 130 (FIG. 3). More specifically, the module 200 performs the functions of SAE J-1772 (for NEMA markets) or IEC 62196 (for the rest of the world or where applicable) and provides a pilot signal 202 (and an optional proximity signal 204) outputs and inputs in addition to interfacing an external user interface 206. The module 200 controls the PVMCB 100 to perform proper power interlock and conform to the appropriate standards. It allocates metering information into a plug session history and can perform analytic functions (e.g., without limitation, use limitation based on energy; smart scheduling). The module 200 allocates the usage and billing, for example, to a VIN, which can be used to collect lost tax revenue from fuel purchases, enables throttling (e.g., controlling the rate of charge), and panel coordination (e.g., coordination with other controllable PVM circuit breakers to reduce or manage overall demand usage for an entire circuit breaker panel or utility service) in order to prevent demand charges.

The module 200 includes a first conductor finger 208 for a first hot line to the PVMCB 100, and a second conductor finger 210 for a second hot line or a neutral to such PVMCB. The conductor fingers 208,210 are electrically connected to respective terminals 212,214 for an electric load 215. These terminals can be used to provide AC power into the EV connector (not shown). For a single-pole EV circuit breaker, these are a hot line and a neutral. For a two-pole EV circuit breaker, these are two hot lines. For a three-pole EV circuit breaker, these are three hot lines.

A number of current sensors 216, such as current transformers, sense a differential current for a ground fault protection circuit 218, which can output a fault signal and other current information to a logic circuit 220. The logic circuit 220, in turn, can communicate externally through a communication circuit 222 to a first expansion port 224 (e.g., without limitation, to provide a trip signal to the PVMCB 100) and/or a second expansion port 226 to communicate with other local or remote devices (not shown).

The logic circuit 220 also communicates with a memory 228 and the external user interface 206, which can include a number of indicator lights 230 and a reset button 232. In support of various EV interface functions, the logic circuit 220 further communicates with a DC, PWM output and sensor function 234 that interfaces the pilot signal 202 at terminal 236 and an optional proximity circuit 238 that interfaces the optional proximity signal 204 (or proximity resistor (not shown)) at terminal 240 for an IEC style EV add-on module. The module 200 also includes a ground pigtail 242 that provides a ground to a ground terminal 244.

The example module 200 can be employed with the PVMCB 100 or any suitable circuit breaker disclosed herein that feeds a suitable electric load. Example protective functions performed by such circuit breakers can include overcurrent, ground fault, overvoltage, load interlock and/or a safe automatic reset. Example control functions include interfaces to the module 200, a suitable algorithm for the load (e.g., EV) and state management for the load (e.g., EV).

Example authentication functions performed by the module 200 include verification of permission to access power or control of the circuit breaker (i.e., vending power to a load), either locally or remotely, and additional logic and interlock settings. As an example, these include determining whether you are allowed to use power for the load (e.g., to charge an EV), or determining if you are an administrator allowed to control the circuit breakers.

Example allocation functions performed by the PVMCB 100 include tracking energy usage by department, circuit or user, limiting the amount of energy usage, and utility grade energy metering (e.g., 0.2% accuracy of metering energy).

Example optional and additional protection and control functions that can be enabled in the PVMCB 100 by the module 200 include interchangeable communication interfaces, remote control and additional trip curves.

Example 10

Figure 5:
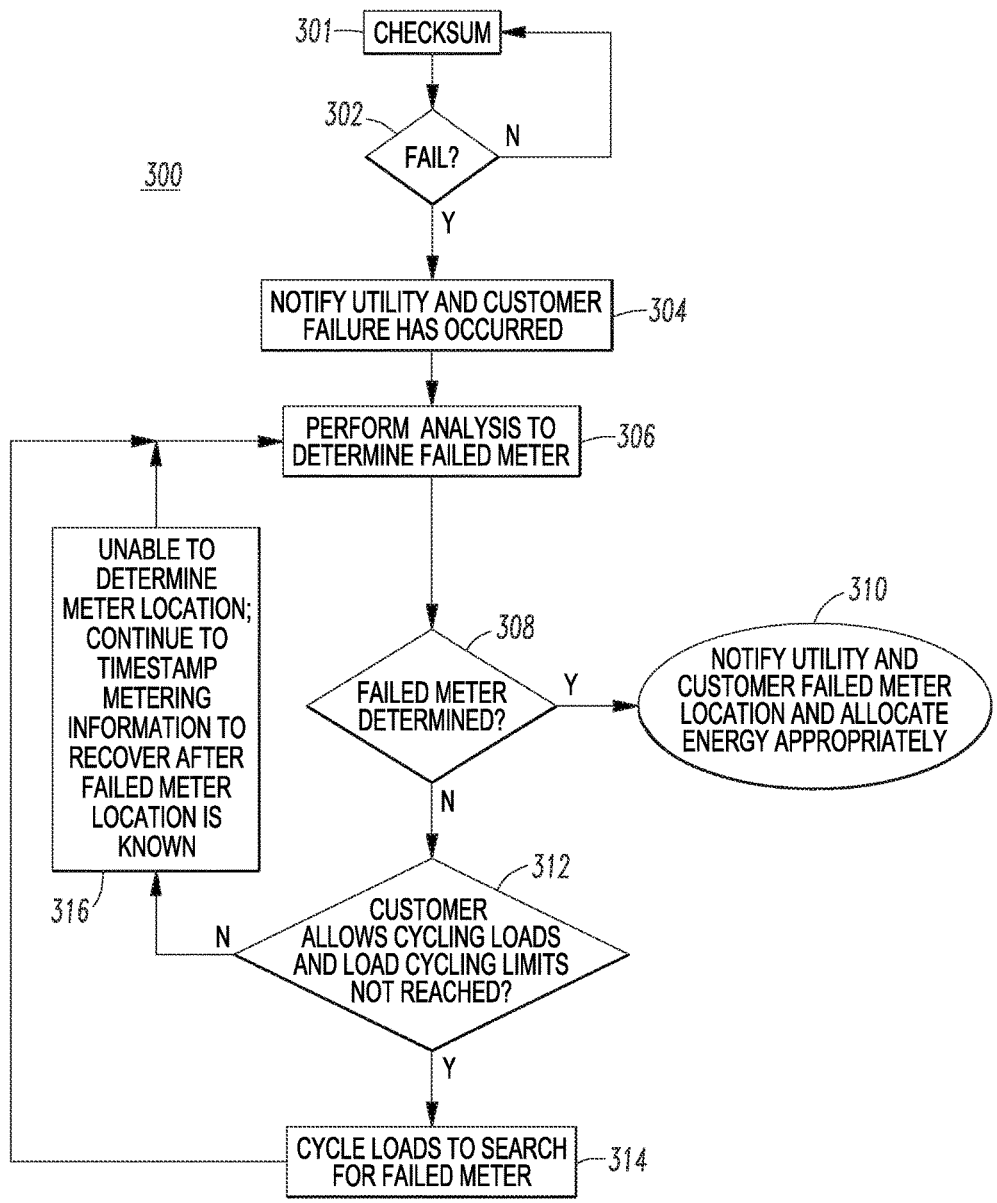
FIG. 5 is a flowchart of a checksum function in accordance with embodiments of the disclosed concept.

The remote software 140 of FIG. 2 can be a checksum function 300, as shown in FIG. 5. For example and without limitation, the example checksum function 300 can be executed as part of a PVMCB 402 (FIG. 7), which can be similar to the PVMCB 100 of FIGS. 2 and 3, for a plurality of branch circuit breakers, such as the PVMCB 100 of FIGS. 2 and 3 or the PVMCBs 404 of FIG. 7.

First, at 301, a checksum, such as was disclosed, above, in connection with Equation 2, is executed. For example, the PVMCB 402 (FIG. 7) main circuit breaker (not shown) can collect time-stamped energy values from the branch PVMCBs 404 (FIG. 7) for comparison with its locally collected time-stamped energy values. For a particular time-stamp (e.g., without limitation, one second intervals; any suitable time range), the various energy-in time-stamped energy values are compared with the various energy-out time-stamped energy values using, for example, Equation 3, at 302. If there is no failure at 302, then 301 is repeated for the next time-stamp. On the other hand, if there is a failure (e.g., Equation 3 is true), then at 304 the electric utility and the electric power customer are notified of the failure. Next, at 306, an analysis is performed to determine the failed "meter" (e.g., the failed PVMCB 100 or metering function 102 of FIG. 2; the main circuit breaker; one of the branch circuit breakers), as will be discussed in greater detail, below, in connection with Examples 13-16 and 32.

If a failed "meter" is determined at 308, then the electric utility and the electric power customer are notified of the location of the failed meter and energy is allocated appropriately at 310, as will be discussed in greater detail, below, in connection with Example 23 and Equation 4.

Otherwise, if the failed "meter" is not determined at 308, then at 312, it is determined if the customer allows cycling loads and if load cycling limits are not yet reached. If so, then at 314, a number of loads are cycled in order to search for the failed meter before execution resumes at 306.

On the other hand, if the customer does not allow cycling loads or if the load cycling limits are reached at 312, then at 316, the checksum function 300 is unable to determine the failed meter location, and the metering function 102 (FIG. 2) continues to time-stamp metering information (e.g., without limitation, power values; energy values) to recover after the failed meter location is known.

Example 11

At 302, the checksum function 300 can determine a predetermined plurality of consecutive occurrences of the failure of Equation 3 before responsively notifying at least one of the electric utility and the customer at 304.

Example 12

At 302, the checksum function 300 can determine a predetermined number of consecutive occurrences of the failure of Equation 3 before responsively notifying at least one of the electric utility and the customer at 304.

Example 13

At 306, the checksum function 300 can determine which one of the PVMCBs failed by comparing a number of stored load events in the PVMCB database 108 (FIG. 3) with a plurality of predetermined load signatures. For example, at or about the time-stamp for the failure of the checksum function 300, if the stored load event is quite different than the predetermined load signatures, then the corresponding PVMCB is likely the failed "meter". See, also, Example 5.

Example 14

At 306, the checksum function 300 can determine which one of the PVMCBs failed by evaluating temperature versus time information and energy versus time information for a number of the branch PVMCBs. For example, at or about the time-stamp for the failure of the checksum function 300, if the outside temperature was relatively quite high and the energy versus time information was about zero for one of the branch PVMCBs associated with an air conditioner load, then that PVMCB is likely the failed "meter". See, also, Example 6.

Example 15

At 306, the checksum function 300 can determine which one of the PVMCBs failed by evaluating at least one of: (1) expected energy versus time information, power source or power sink with actual energy versus time information; and (2) load type or rated current with actual current versus time information, for a number of the branch PVMCBs. See, for example, Example 7.

Example 16

Figure 6A:
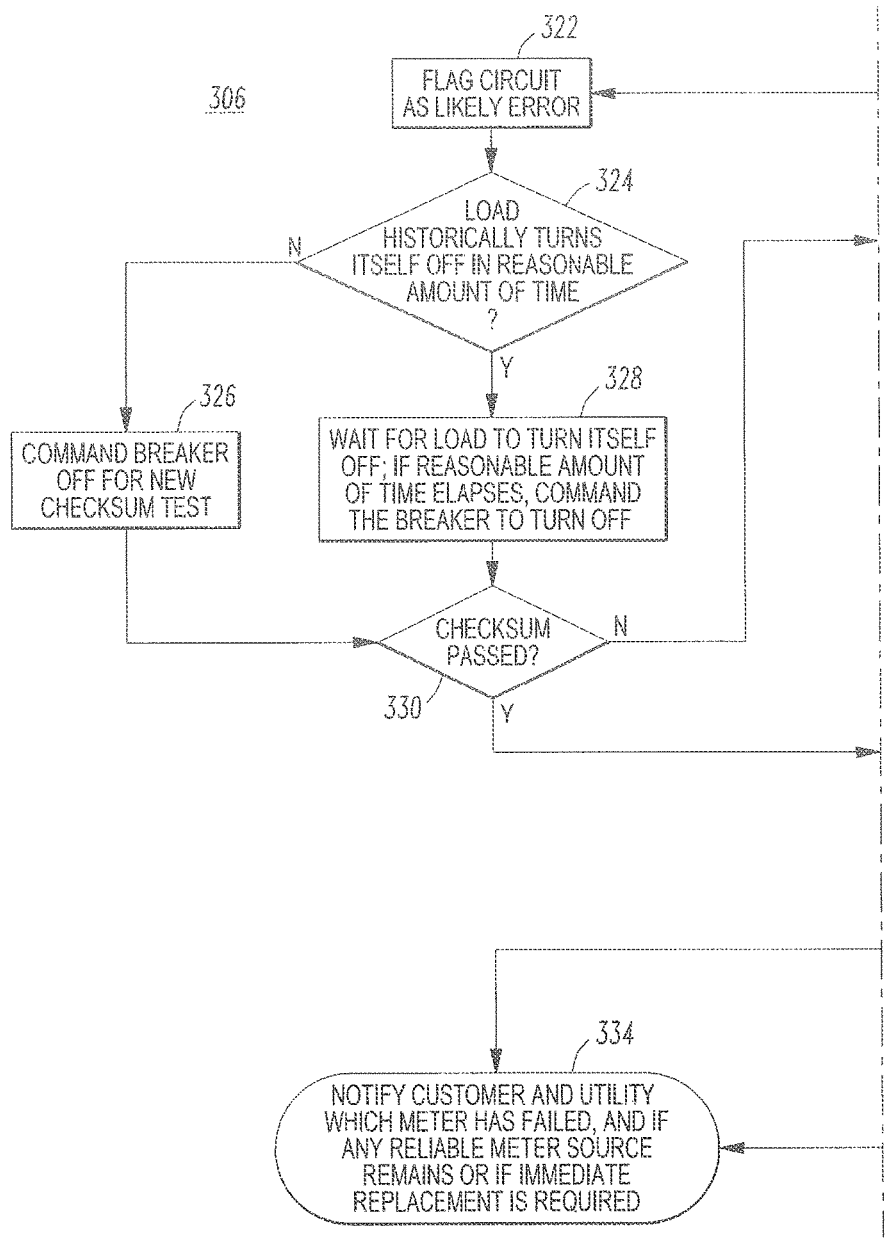
FIGS. 6A-6B form a relatively more detailed flowchart of a portion of the checksum function of FIG. 5.
Figure 6B:
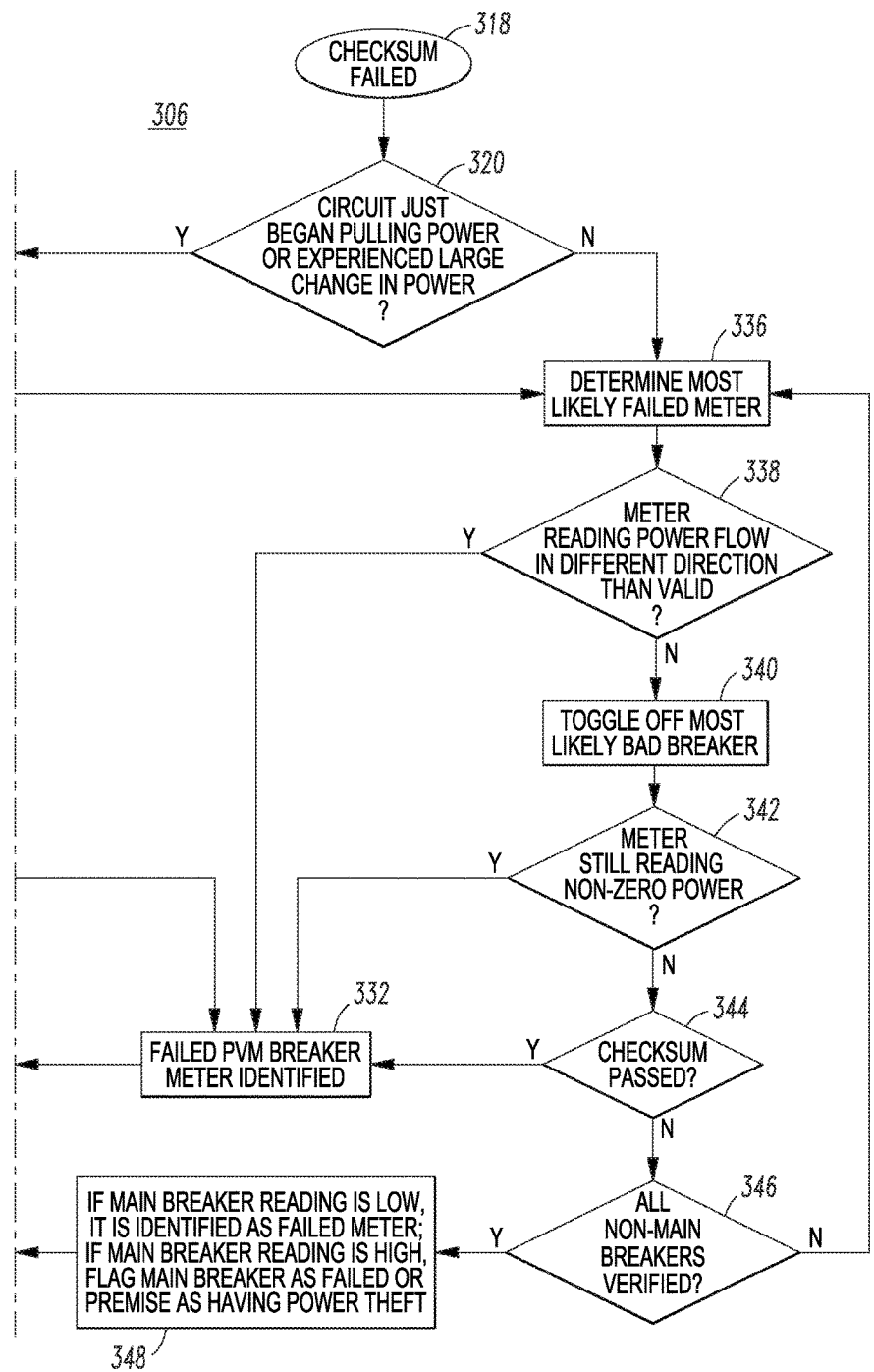

FIGS. 6A-6B show a relatively more detailed flowchart of steps 306,308,310,312,314,316 of the checksum function 300 of FIG. 5. The goal is to accurately determine which meter failed, notify the electric utility and the customer (e.g., premise), determine if accurate metering information is still possible, and make it available, all with minimal power interruption.

If the checksum function 300 fails at 302 of FIG. 5, as shown at 318 of FIG. 6B, then the PVMCB with the failed "meter" is identified. At 320, it is determined if a power circuit just begin pulling power or experienced a relatively large change in power. If so, then at 322, that power circuit and the corresponding PVMCB are flagged as being the likely error. Next, at 324, it is determined if the load for that power circuit historically turns itself off in a reasonable predetermined amount of time. If not, then at 326, the corresponding PVMCB is turned off for a new checksum test at the next time-stamp. On the other hand, if the load for that power circuit does historically turn itself off in a reasonable predetermined amount of time, then at 328, either wait for the load to turn itself off or if the predetermined amount of time elapses, then the corresponding PVMCB is turned off for a new checksum test at the next time-stamp. Next, after 326 or 328, at 330, it is determined if the checksum passed for the next time-stamp. If so, then at 332, the PVMCB with the failed "meter" is identified. Finally, at 334, the customer (e.g., facility manager; homeowner) and the electric utility are notified which "meter" failed, and if any reliable meter source remains (as will be discussed, below, in connection with Example 23) or if immediate replacement of the failed "meter" is needed.

On the other hand, if the power circuit did not just begin pulling power and did not experience a relatively large change in power at 320, or if the checksum did not pass at 330, then beginning at 336, steps are taken to determine the most likely failed meter. Here, power circuits with no load provide no information, unless the routine 306 was waiting (e.g., if a load is historically cyclical in nature and it is predictive as to when it should turn on/off, then the function 300 can wait for when that load is anticipated to turn on before it tries to determine whether or not it is at fault) or unless it was just turned off (e.g., steps 326, 328 or 340) and can be determined to be the cause of the problem. The likely failed meter is determined, for example and without limitation, by a variance in power, by when the last major spike (on or off) in power occurred, historical power trending and/or other possible inputs.

Next, at 338, it is determined if the PVMCB meter, as was determined at 336, is reading power flow in a different direction than is valid (e.g., the meter for a dedicated branch PVMCB for a power-consuming load, such as HVAC, is showing power generation in error). If so, then the PVMCB with the failed "meter" is identified at 332.

On the other hand, if the power flow is in the correct direction at 338, then at 340, the PVMCB meter, as was determined at 336, is toggled off at 340. Next, at 342, it is determined if that PVMCB meter, as was determined at 336, is still reading non-zero power. If so, then the PVMCB with the failed "meter" is identified at 332.

On the other hand, if zero power was read at 342, then at 344 it is determined if a new checksum test at the next time-stamp passes at 344. If so, then the PVMCB with the failed "meter" is identified at 332.

On the other hand, if the checksum test failed at 344, then at 346 it is determined if all branch PVMCBs are verified. If not, then execution resumes at 336 with the next most likely failed meter.

Otherwise, if all branch PVMCBs are verified at 346, then if the main PVMCB energy is low relative to the sum of the energies of all of the branch PVMCBs, then it is identified as the failed "meter" at 348. Otherwise, at 348, if the main PVMCB energy is high relative to the sum of the energies of all of the branch PVMCBs, then it is identified as the failed "meter" or the premise is identified as having power theft at 348. Finally, after 348, step 334 is executed to suitably notify the customer and the electric utility as was discussed above.

At either 346 or 348, it is also possible that multiple meters or PVMCBs failed simultaneously. However, this is believed to be a relatively very rare occurrence and is not easily identified without turning the power off multiple times. Generally, the checksum function 300 cannot detect and treat multiple simultaneous failures with absolute certainly. However, there are certain situations where a simultaneous failure can be indicated as being suspected.

Example 17

Other possible places to use the checksum function 300 include, for example and without limitation, at a generation site, and within transmission lines. The checksum function 300 can also be employed to help electric utilities locate power "leaks" (e.g., places where power is "leaking" or lost, for example, to ground; places where a conductive power bus or power line material is failing, increasing resistance and heating up excessively). Here, power is not necessarily being stolen, but electric utility resources are being lost or wasted.

Example 18

Figure 7:
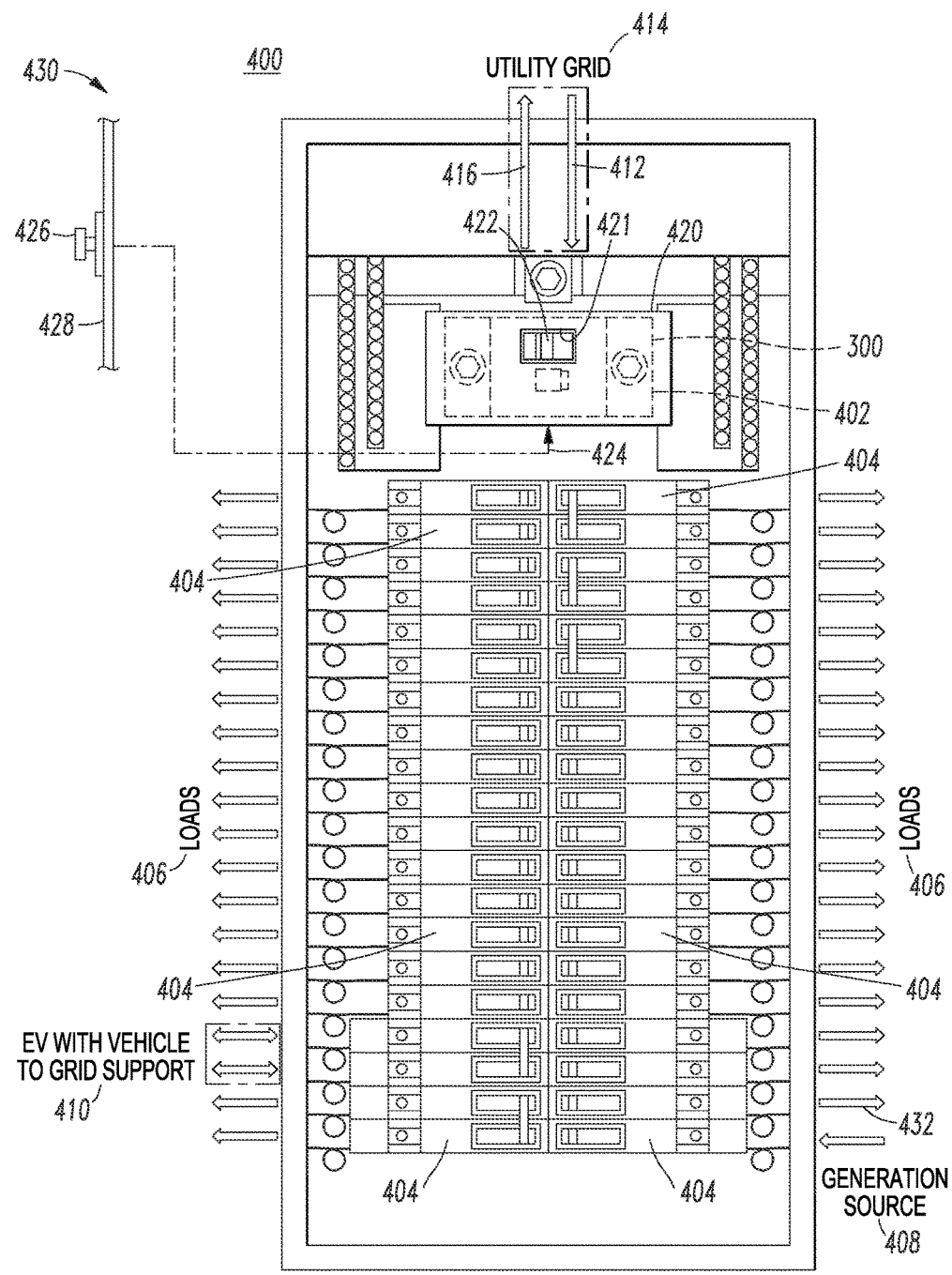
FIG. 7 is a power vending machine load center including the checksum function of FIG. 5.

FIG. 7 shows a power vending machine (PVM) load center 400 including a main PVMCB 402 having the checksum function 300 of FIG. 5. The PVM load center 400 also includes a plurality of branch PVMCBs 404. The branch PVMCBs 404 can generally be associated with a plurality of power-consuming loads 406. However, it is possible that a number of the branch PVMCBs 404 can be associated with a generation source, such as 408, or with an EV (with vehicle to grid support) 410.

For example, an EV contains a battery or other suitable stored energy medium. In a normal application, the EV battery is charged from the grid and is therefore consuming power. However, there are applications where the EV battery could also supply power to a home by converting the stored energy back to AC power and act essentially like a generator in an emergency situation (this is also sometimes referred to as reverse power flow). As a result, the EV is unique in that it can serve as both a consumer and generator of power. There are also applications where utilities are taking a simple battery bank as distributed energy storage to do the same thing except without the actual vehicle. In addition to emergency usage, it can also be used where it charges the battery at night (during utility off-peak hours when rates are relatively cheaper) and then discharges during the day (during utility on-peak hours when rates are relatively more expensive).

Generally, the main PVMCB 402 receives power 412 from the utility grid 414. However, with the generation source 408, for example, it is possible that the main PVMCB 402 can source power 416 to the utility grid 414. In Equations 2 and 3, power 412 from the utility grid 414 corresponds to a positive value of $E_{in}$, and power 416 to the utility grid 414 corresponds to a negative value of $E_{in}$.

Similarly, for the branch PVMCBs 404, power flowing to the loads 406 corresponds to a positive value of $E_{out}$, and power flowing from the generation source 408 back toward the utility grid 414 corresponds to a negative value of $E_{out}$.

Example 19

Figure 10:
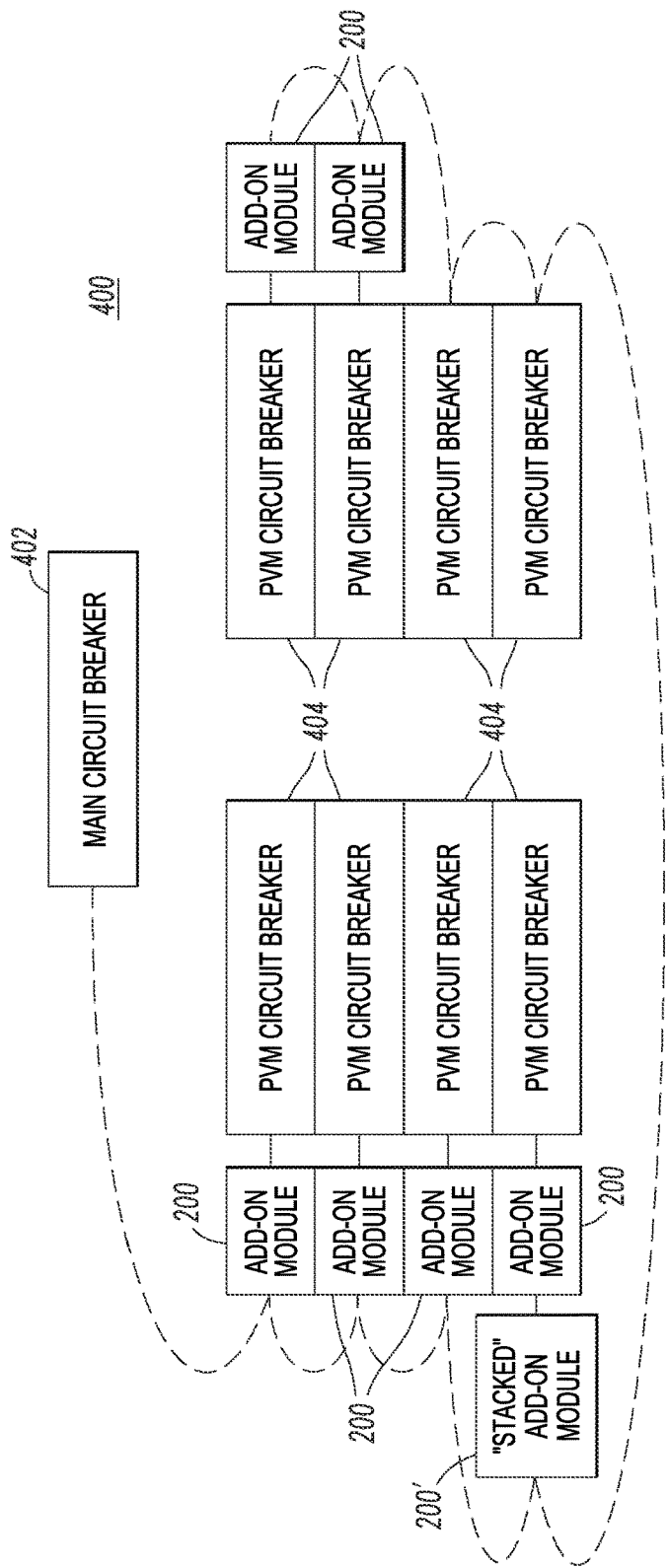
FIG. 10 is a block diagram of communications for the load center of FIG. 7.

The main PVMCB 402 includes a communication circuit 134 and/or 136 (FIG. 2) structured to receive information from the branch PVMCBs 404 and communicate the information to a remote location, such as 140 (FIG. 2). This information can include, for example and without limitation, an identification of trip status and time of trip for each of the branch PVMCBs 404, and an identification of trip status and occurrence of a predetermined power signature for each of the branch PVMCBs 404. The branch PVMCBs 404 similarly include a communication circuit 134 and/or 136 (FIG. 2) structured to send such information to the main PVMCB 402. FIG. 10 shows one example of communications between the various PVMCBs 402,404, and the add-on modules 200,200' for the PVMCBs 404.

Example 20

Similar to Example 19, the main PVMCB communication circuit 134 and/or 136 (FIG. 2) can be structured to receive an open or close command from the remote location and communicate the open or close command to a corresponding one of the branch PVMCBs 404 using their corresponding communication circuit 134 and/or 136 (FIG. 2).

Example 21

Figure 8:
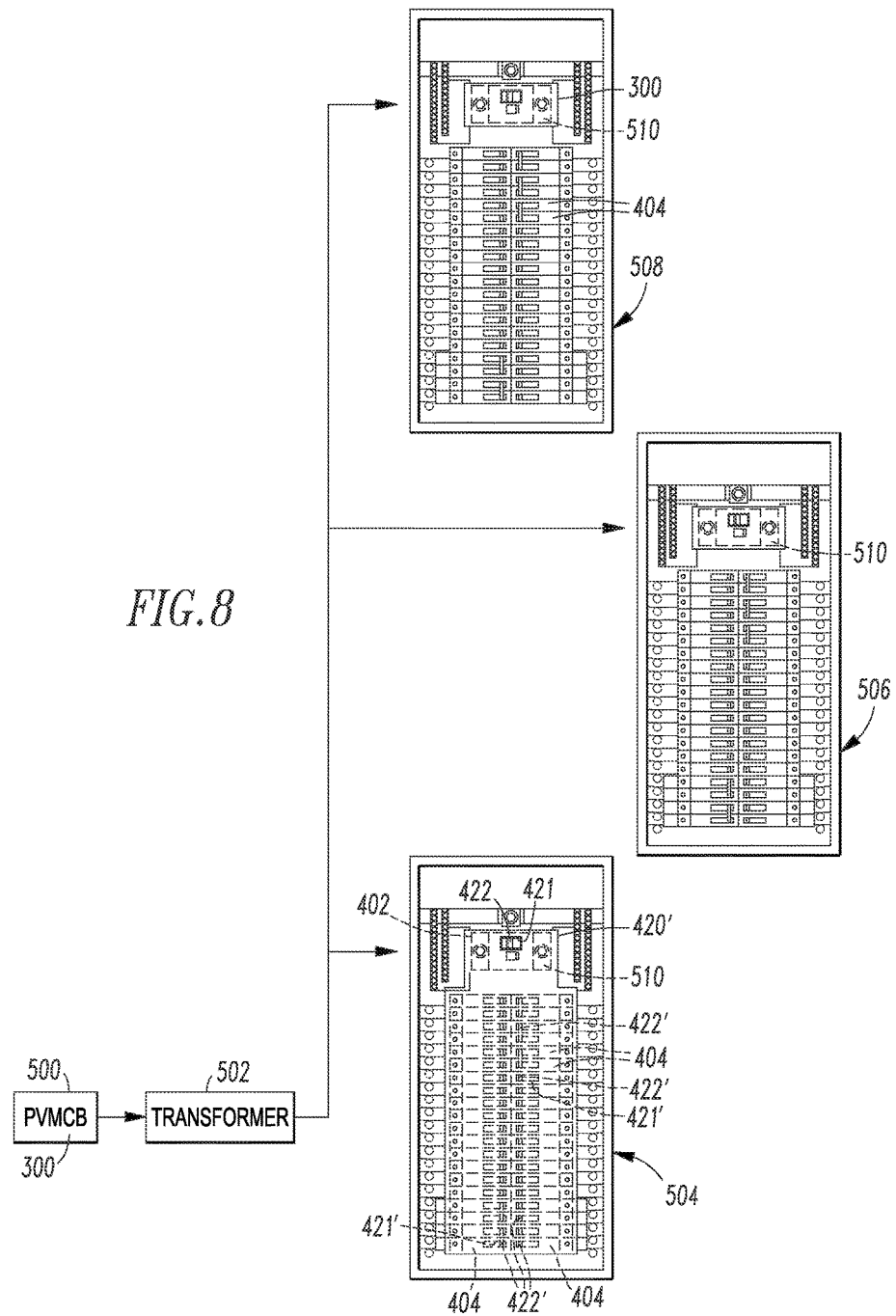
FIG. 8 is a block diagram of a transformer and a plurality of load centers including the checksum function of FIG. 5.

The disclosed concept can be directed to, for example, a panel of PVMCBs, including the main PVMCB 402 and branch PVMCBs 404 as are shown in FIG. 7. This provides the checksum function 300 (FIG. 5) that can verify billing accuracy and notify an electric utility in the event of theft or insufficient billing of electric power. Alternatively, the checksum function 300 can be applied in other areas, such as between a transformer 502 and a plurality of downstream load centers 504,506,508 as are shown in FIG. 8.

Example 22

The PVMCB checksum function 300 can be applied to applications other than load centers or panelboards. This function 300 can prevent theft of power and automatically verify the accuracy of meter readings anywhere in an electric power distribution system.

Example 23

In FIG. 7, energy flows inside the example PVM load center 400. Power can flow in either direction and the disclosed function 300 still works correctly. In addition to verification, if a single meter fails and is identified, the PVM load center 400 can still correctly allocate energy usage to each individual branch PVMCB 404 (including the branch power circuit of the failed PVMCB) by employing Equation 4:

$$\Sigma E_{in} - \Sigma E_{out} - \Sigma E_{loss} - E_{Failed\ PVM\ Breaker\ Reading} = E_{Failed\ PVM\ Breaker\ Actual} \quad (\text{Eq. 4})$$

wherein:

$E_{Failed\ PVM\ Breaker\ Reading}$ is the inaccurate energy reading from a failed PVMCB that must be removed from Equations 2 and 3; and $E_{Failed\ PVM\ Breaker\ Actual}$ is the actual energy flowing through the failed PVMCB.

As was discussed, above, in connection with FIGS. 6A-6B, the routine 306 allocates a plurality of time-stamped energy values for a predetermined time period to one of the PVM-CBs 402,404 that failed after the failure of the checksum function 300 at 302 (FIG. 5) or 318 (FIG. 6B).

Equation 4 assumes that the energy measurement error is negligible and that a meter reading at the required level of accuracy is still possible. When the example PVM load center 400 is operating in this mode, it can no longer perform step 301 of the checksum function 300, and assumes that all other meters are operating correctly (i.e., the PVM load center 400 can no longer perform verification). This mode is intended to be employed for a relatively short duration until the faulty meter can be identified and replaced.

Example 24

The energy loss $E_{loss}$ term of Equations 2-4 can correspond to energy losses (e.g., $I^2R$) in, for example and without limitation, line bus bars (not shown) of the PVM load center 400 between the main PVMCB 402 and the branch PVMCBs 404.

Example 25

The main PVMCB 402 can be placed in a lock-out compartment 420 in order to prevent tampering. The service disconnect (e.g., operator handle 422) is still accessible and remotely controllable. The lock-out compartment 420 substantially encloses the main PVMCB 402 and restricts access thereto. The lock-out compartment 420 includes an opening 421, and the operating handle 422 passes through the lock-out compartment opening 421, in order to permit access to the operating handle 422 by a user.

Alternatively, the lock-out compartment 420' of FIG. 8 includes openings 421,421' for the operating handles 422, 422' of all of the respective PVMCB circuit breakers 402, 404, which are substantially enclosed therein to restrict access to prevent tampering.

Example 26

A shunt trip 424 can be added to the main PVMCB 402 with, for example and without limitation, a button or other suitable user input device 426 on the exterior 428 of a building 430, in order to meet fire codes requiring an accessible whole-home disconnect.

Example 27

Additional information can be communicated in real time to emergency responders at a remote location, such as 140 (FIG. 2), by the main PVMCB 402. This can include information, such as which ones of the branch PVMCBs 404 have tripped and in what order. This could assist firefighters to determine the source and location of a fire in the building 430. Another possibility is automatic notification of a possible electrocution if a certain power signature is observed (e.g., without limitation, a ground fault 432 in a bath room).

Example 28

Also, remote control of individual branch power circuits associated with the branch PVMCBs 404 could be given to emergency responders at a remote location, such as 140 (FIG. 2).

Example 29

A faulty meter can arise from any number of the components of the example PVMCB 100 (e.g., without limitation, voltage sensor(s) 150,151; the current sensor(s) 148,149; analog-to-digital converter (ADC) (not shown) of power metering circuit 152; processor 104) and could involve gain and/or offset error(s). However, an offset error calibration from the factory should not normally drift or change very much over time. As a result, expected errors likely involve a change in the gain calibration.

Although the exact source of the error cannot be determined, it might be possible to pinpoint it close enough for correction. For example, the voltage determination is a combination of a reading from a voltage sensor 150,151 and the ADC. Inside a load center, such as 400, for example, the voltage should be nearly exactly the same for all of the PVMCBs 404. Hence, a voltage error can readily be detected and corrected by the analytics. By adjusting a number of coefficients used in its determination (e.g., without limitation, a simple multiplication term), then the voltage can be re-calibrated back to its correct value. If the re-calibrated voltage changes or drifts, then this error may be unrecoverable, although an average of the various voltages in the load center 400 can be used as a substitute. If, however, the re-calibrated voltage is substantially constant, although it may be difficult to determine what went wrong, the voltage sensor 150 or 151 nevertheless is operational.

Similar calibration can be used for the current sensor(s) 148,149.

Since power is derived from current and voltage, and since energy is derived from power or from current and voltage, knowing the particular device that failed and the amount of erroneous energy, these can be used to re-calibrate the current or voltage sensor(s).

Example 30

The disclosed checksum function 300 improves metering verification (and thereby a utility's ability to meter customers accurately) by performing repetitive verification in real time. When accuracy has been compromised and verification fails on a system with "N" meter points, the checksum function 300 will determine the faulty meter, notify the utility, and then recover the system to operate in a failure mode with "N−1" meters, but without loss of metering capability. Due to the arrangement of the meters, the checksum function 300 is able to properly and accurately meter the N meter points with N−1 meters until the faulty meter can be replaced. The checksum function 300 permits a system of self-verifying devices to remove the burden of meter testing and verification from the electric utility. It also creates a more reliable and accurate metering system for utilities which prevents the theft of electric power while ensuring that customers are properly billed.

Example 31

The checksum function 300 cannot guarantee detection of multiple simultaneous failures. There are certain cases where the checksum function 300 can detect/suspect simultaneous failures based on its analysis, but there are various other cases where it cannot. One example would be when one meter reading errs on the high side and a second meter reading errs of equal magnitude on the low side and the combination of the two offset each other. As a result, the checksum function 300 may not be able to detect such errors. However, the occurrence of multiple, simultaneous errors occurring (having started at the same time), is statistically an outlier.

If there are multiple errors that offset each other, but they are not simultaneous (having started at different times), then the checksum function 300 may not be able to discern whether there are multiple errors or if the first error has been fixed or was an anomaly. Therefore, the checksum function 300 flags this scenario as an error and notifies the utility and customer appropriately.

The checksum function 300 may not be able to allocate energy to every power circuit after a simultaneous failure has occurred. Each individual meter point can still be allocated, but it will be unverified, since the checksum function 300 does not have enough information to fully properly function.

Example 32

FIG. 8 shows an upstream PVMCB 500 including the checksum function 300 of FIG. 5, a transformer 502 and a plurality of load centers 504,506,508. Each of the load centers 504,506,508 includes a main PVMCB 510, which is similar to the main PVMCB 402 of FIG. 7, except that the main PVMCB 510 need not include the checksum function 300. Here, the checksum function 300 is employed to check energy flowing through the transformer 502 and through multiple load centers 504,506,508 possibly located at different premises. This is an additional place in a distribution system where an electric utility could employ this checksum function 300 to, for example, annunciate and prevent the theft or loss of power.

Example 33

As was discussed, the disclosed concept does not address, with certainty, a scenario of a plurality of meter failures occurring simultaneously. In this example, the main PVMCB 510 does include the checksum function 300 for operation with its downstream branch PVMCBs 404. Using an additional set of devices, such as shown in FIG. 8, to perform multiple checksum functions 300 could help validate where a "meter" has actually failed. For example, if two branch PVMCBs 404 (FIGS. 7 and 8) fail simultaneously, then the checksum function 300 of FIG. 5 would indicate that the main PVMCB 402 (FIG. 7) or the main PVMCB 510 of the load center 508 (FIG. 8) failed. However, if the checksum function 300 is still passing between the transformer 502 as executed at the example PVMCB 500 and the main PVMCBs 510 (FIG. 8) electrically connected thereto, then the main PVMCB 510 of the load center 508 (FIG. 8) has not failed even though the checksum function 300 of PVMCB 510 could say that it is if the two branch PVMCBs 404 (FIG. 8) fail simultaneously.

Example 34

Figure 9:
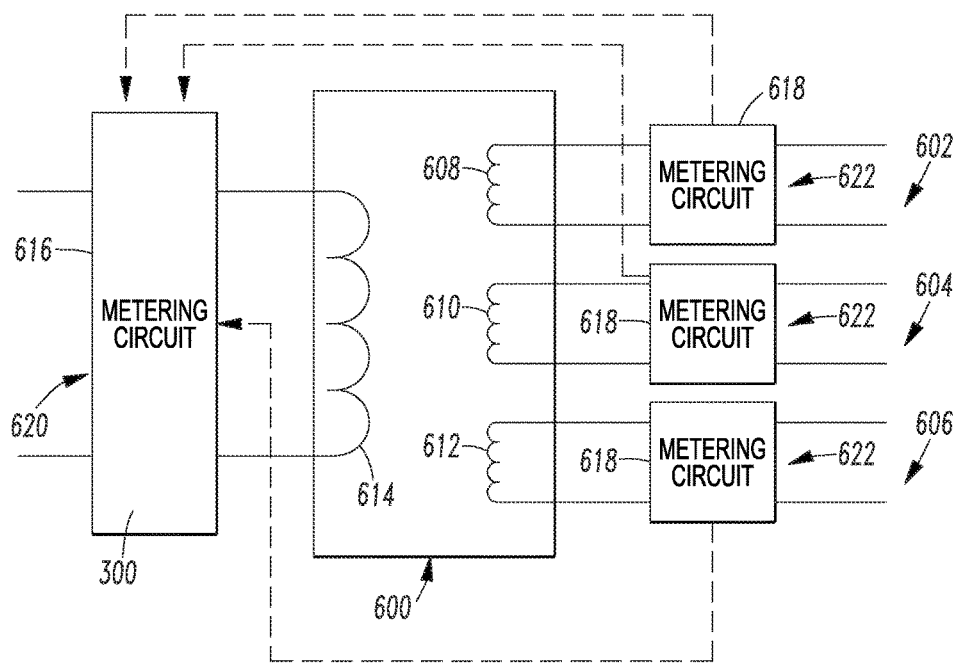
FIG. 9 is a block diagram of a transformer and a plurality of transmission lines including the checksum function of FIG. 5.

FIG. 9 shows a transformer 600 and a plurality of transmission lines 602,604,606 including the checksum function 300 of FIG. 5. The transformer 600 includes a plurality of secondary windings 608,610,612 and a primary winding 614 having a first metering circuit 616 including the checksum function 300. Each of the downstream transmission lines 602,604,606 corresponds to one of the secondary windings 608,610,612, respectively, and includes a second metering circuit 618. The metering circuits 616,618 can be part of respective PVMCBs 620,622, as shown. For equation 4, the $E_{loss}$ term can include expected energy losses in the transformer 600.

For utilities, branch circuit metering and control with guaranteed accuracy allows better service to their territories, increases the amount of information used to make decisions, offers new rate structures, provides remote meter reading, remote service disconnects and an emergency demand response system, prevents theft of power, and helps to improve asset utilization.

For consumers, PVMCBs, such as 100, and add-on modules, such as 126 or 200, assure accurate billing, help conserve energy, and increase the value and usefulness of their load center and the devices supported therein.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electric power distribution system for use with an electric power source, said electric power distribution system comprising:

a first device exchanging first electric power with said electric power source, said first device being structured to exchange said first electric power with a plurality of second devices and to meter first electric energy corresponding to said first electric power;

said plurality of second devices structured to exchange said first electric power with said first device, each of said second devices being structured to exchange second electric power as at least part of said first electric power with a number of corresponding electric loads and to meter second electric energy corresponding to said second electric power; and a processor comprising a routine structured to compare the metered first electric energy from said first device with a sum of the metered second electric energy from each of said second devices, and to responsively determine improper operation of said electric power distribution system when the metered first electric energy from said first device less the summed metered second electric energy from each of said second devices is greater than a sum of losses in power conductors operatively associated with said second devices, plus expected errors in metering by each of said first device and said second devices, wherein said first device is a main circuit breaker, wherein said second devices are a plurality of branch circuit breakers, and wherein said processor is included in said first device, and wherein said routine is further structured to determine which one of said second devices failed responsive to said determined improper operation.

2. The electric power distribution system of claim 1 wherein said routine is further structured to notify an electric utility corresponding to said electric power source responsive to said determined improper operation.

3. The electric power distribution system of claim 1 wherein said routine is further structured to allocate energy to said one of said second devices that failed responsive to said determined improper operation.

4. The electric power distribution system of claim 1 wherein said routine is further structured to allocate a plurality of time-stamped energy values for a predetermined time period to said one of said second devices that failed after said determined improper operation.

5. The electric power distribution system of claim 1 wherein each of said first device and said second devices includes a metering circuit; and wherein said routine is further structured to adjust said compare for at least one of energy losses in power conductors operatively associated with said second devices, and expected errors in the metering circuit of each of said first device and said second devices.

6. The electric power distribution system of claim 1 wherein said routine is further structured to determine a predetermined plurality of consecutive occurrences of said determined improper operation and responsively notify at least one of an electric utility corresponding to said electric power source and a customer for said second electric power.

7. The electric power distribution system of claim 1 wherein said routine is further structured to determine a predetermined number of occurrences of said determined improper operation and responsively notify at least one of an electric utility corresponding to said electric power source and a customer for said second electric power.

8. The electric power distribution system of claim 7 wherein said routine is further structured to determine which one of said second devices failed by comparing a number of load events with a plurality of predetermined load signatures.

9. The electric power distribution system of claim 7 wherein said routine is further structured to determine which one of said second devices failed by evaluating temperature versus time information and energy versus time information for a number of said second devices.

10. The electric power distribution system of claim 7 wherein said routine is further structured to determine which one of said second devices failed by evaluating at least one of: expected energy versus time information, power source or power sink with actual energy versus time information; and load type or rated current with actual current versus time information, for a number of said second devices.

11. The electric power distribution system of claim 7 wherein said routine is further structured to determine which one of said second devices failed by evaluating at least one of: installation date; and number of operating cycles, for a plurality of said first device and said second devices.

12. The electric power distribution system of claim 7 wherein said routine is further structured to determine which one of said second devices failed by turning one of said second devices off and repeating said compare the metered first electric energy from said first device with a sum of the metered second electric energy from each of said second devices except for said one of said second devices and to responsively re-determine said proper or said improper operation based upon said repeating said compare.

13. The electric power distribution system of claim 7 wherein said routine is further structured to determine which one of said second devices failed, and to responsively determine a second electric energy for said one of said first device and said second devices that failed from the metered first electric energy from said first device, less the sum of the metered second electric energy from each of said second devices, less energy losses in power conductors operatively associated with said second devices, less the metered second electric energy from said one of said first device and said second devices that failed.

14. The electric power distribution system of claim 1 wherein said routine is further structured to determine which one of said second devices failed responsive to said determined improper operation by checking for reverse power flow back toward said electric power source.

15. The electric power distribution system of claim 1 wherein said main circuit breaker and said plurality of branch circuit breakers are housed in a panelboard or load center; wherein said main circuit breaker includes an operating handle; wherein said panelboard or load center includes a lock-out compartment substantially enclosing said main circuit breaker and restricting access thereto, said lock-out compartment including an opening, the operating handle passing through the opening of said lock-out compartment, in order to permit access to the operating handle by a user.

16. The electric power distribution system of claim 1 wherein said main circuit breaker and said plurality of branch circuit breakers are housed in a panelboard or load center inside of a building; and wherein a shunt trip user interface is disposed outside of said building and interfaced to said main circuit breaker, in order to manually trip open said main circuit breaker from outside of said building.

17. The electric power distribution system of claim 1 wherein said main circuit breaker comprises a communication circuit structured to receive information from said branch circuit breakers and communicate said information to a remote location; and wherein said information is selected from the group consisting of an identification of trip status and time of trip for each of said branch circuit breakers, and an identification of trip status and occurrence of a predetermined power signature for each of said branch circuit breakers.

18. The electric power distribution system of claim 1 wherein said main circuit breaker comprises a communication circuit structured to receive an open or close command from a remote location and communicate said open or close command to a corresponding one of said branch circuit breakers.

19. The electric power distribution system of claim 1 wherein said first device is an upstream power distribution device having a first metering circuit; and wherein said second devices are a plurality of downstream power distribution devices, each of said downstream power distribution devices including a second metering circuit.

20. The electric power distribution system of claim 1 wherein said main circuit breaker and said plurality of branch circuit breakers are housed in a panelboard or load center; wherein each of said main circuit breaker and said branch circuit breakers includes an operating handle; wherein said panelboard or load center includes a lock-out compartment substantially enclosing said main circuit breaker and said branch circuit breakers and restricting access thereto; and wherein said lock-out compartment includes a plurality of openings, the operating handle of a corresponding one of said main circuit breaker and said branch circuit breakers passing through a corresponding one of the openings of said lock-out compartment, in order to permit access to the operating handle by a user.

21. The electric power distribution system of claim 1 wherein at least one of said number of corresponding electric loads is structured to generate electric power; wherein a corresponding one of said second devices is further structured to send said generated electric power back to said first device; and wherein said metered second electric energy of said corresponding one of said second devices has a negative value.

22. The electric power distribution system of claim 21 wherein said first device is further structured to send electric power back to said electric power source; and wherein said metered first electric energy has a negative value.

23. A method of evaluating energy metering of an electric power distribution system for use with an electric power source, the method comprising:
providing the electric power distribution system comprising a first device exchanging first electric power with said electric power source, said first device exchanging the first electric power with a plurality of second devices and metering first electric energy corresponding to said first electric power, said plurality of second devices exchanging the first electric power with said first device, each of said second devices exchanging second electric power as at least part of said first electric power with a number of corresponding electric loads and metering second electric energy corresponding to said second electric power, wherein said first device is a main circuit breaker and said second devices are a plurality of branch circuit breakers;
summing, with a processor included in the first device, the metered second electric energy from each of said second devices; and
comparing with the processor the metered first electric energy from said first device with the summed metered second electric energy from each of said second devices, and responsively determining improper operation of said metering first electric energy and said metering second electric energy when the metered first electric energy from said first device less the summed metered second electric energy from each of said second devices is greater than a sum of losses in power conductors operatively associated with said second devices, plus expected errors in metering by each of said first device and said second devices; and
determining with the processor which one of said second devices failed responsive to said determined improper operation.

\* \* \* \* \*